(12) United States Patent
Jolly et al.

(10) Patent No.: US 11,747,387 B2
(45) Date of Patent: Sep. 5, 2023

(54) OPEN CIRCUIT FAULT MANAGEMENT ON OVERHEAD LINES

(71) Applicant: Siemens Aktiengesellschaft, Munich (DE)

(72) Inventors: Shibu Jolly, Goa (IN); Mayur Mahambrey, Goa (IN); Vengatasubramanian Muthuraman, Goa (IN); Vivek Sharma, Goa (IN)

(73) Assignee: SIEMENS AKTIENGESELLSCHAFT

( * ) Notice: Subject to any disclaimer, the term of this patent is extended or adjusted under 35 U.S.C. 154(b) by 0 days.

(21) Appl. No.: 17/677,110

(22) Filed: Feb. 22, 2022

(65) Prior Publication Data

US 2022/0268825 A1    Aug. 25, 2022

(30) Foreign Application Priority Data

Feb. 24, 2021    (IN) .............................. 202141007740

(51) Int. Cl.
    *G01R 31/08*    (2020.01)
(52) U.S. Cl.
    CPC ......... *G01R 31/085* (2013.01); *G01R 31/088* (2013.01)
(58) Field of Classification Search
    CPC .... G01R 31/08; G01R 31/085; G01R 31/088; G01R 31/086; G01R 31/1272; G01R 31/2836; G01R 11/25; G01R 22/068; G05B 23/02; G05B 23/0218; G05B 23/0259; G05B 23/0275
    See application file for complete search history.

(56) References Cited

U.S. PATENT DOCUMENTS

| | | | |
|---|---|---|---|
| 2015/0212138 A1* | 7/2015 | Tsuchiya | G01R 31/08 702/58 |
| 2016/0308345 A1* | 10/2016 | Stoupis | H02H 1/0007 |
| 2019/0004103 A1* | 1/2019 | Liu | H02H 1/0007 |
| 2020/0191841 A1 | 6/2020 | Lakirovich et al. | |

FOREIGN PATENT DOCUMENTS

KR             102026644 B1       9/2019

* cited by examiner

*Primary Examiner* — Son T Le
*Assistant Examiner* — Brian Butler Geiss
(74) *Attorney, Agent, or Firm* — Schmeiser, Olsen & Watts LLP

(57) ABSTRACT

A computer implemented method, a fault detection and management system and a computer program product for managing an open circuit fault on an overhead line in a power network, are provided, that include obtaining overhead line data from a sensor mounted on the overhead line, determining fault detection parameters associated with one or more nodes of the overhead line on occurrence of a predefined node condition, that is, a low voltage and a negative rate of change of line current at the one or more nodes, and generating an output based on the fault detection parameters, wherein the output indicates potential presence of an open circuit at one or more nodes.

20 Claims, 4 Drawing Sheets

OPEN CIRCUIT FAULT MANAGEMENT ON OVERHEAD LINES

CROSS-REFERENCE TO RELATED APPLICATIONS

This application claims priority to Indian Application No. 202141007740, having a filing date of Feb. 24, 2021, the entire contents of which are hereby incorporated by reference.

FIELD OF TECHNOLOGY

The following relates to management of open circuit faults on overhead power distribution lines and more particularly to detection and localization of open circuit faults on overhead power distribution lines.

BACKGROUND

Open circuit faults in power distribution networks caused due to an open jumper cable, a broken power conductor, etc., are very common on the overhead distribution lines. These faults are typically a result of environmental interferences, high fault currents, loose joints of metallic parts due to ageing, etc. On the occurrence of such faults, the utility maintenance team patrols a complete section of the affected overhead line to find the root cause and the origin of the fault.

The existing substation-based devices are largely unable to localize the faulty section on the overhead line. The existing techniques and solutions can only trip and alarm the utility maintenance teams on occurrence of such fault events, who must then trace the fault location based on the affected customer's feedback and by operating an air Brake switch on a trial-and-error basis, which causes unnecessary stress on the power system.

In some of the existing techniques and solutions, open circuit faults in a power distribution network are largely dealt with using unbalance detection features of protection relays. A protection relay gets tripped on occurrence of such faults and the overhead line is discharged whenever a major unbalance exceeding predefined thresholds is detected. This unbalance can be voltage unbalance and/or current unbalance. Thereafter, the overhead line is physically monitored by the utility maintenance team to detect the exact location of fault. Thus, the existing techniques and solutions not only are time intensive but also results in revenue losses for the utility and annoyance to the customers due to manual patrolling and inspection of the overhead lines.

SUMMARY

An aspect relates to a system and a method for managing open circuit faults on overhead lines, that is detecting and localizing open circuit condition(s) in power distribution networks, thereby enabling the utility maintenance teams to directly reach the affected section of the overhead line for repair works thus, reducing patrolling time and therefore the revenue losses.

The present disclosure achieves the aforementioned aspect by providing a computer implemented method and a fault detection and management system (FDAMS) for managing an open circuit fault on an overhead line in a power network. As used herein, "power network" refers to a power distribution network and/or a power transmission network having a voltage rating of about 3.3 kV to about 66 kV.

The computer implemented method disclosed herein obtains overhead line data from a sensor mounted on the overhead line. The overhead line data comprises line voltage and line current present at a node in real-time. A node refers to a physical position on the overhead line where the sensor is mounted. The sensor is, for example, a fault sensing indicator or a V/I sensor. The sensor is capable of providing a status associated with the line voltage such as a low voltage, the line current such as a negative rate of change of the current, and a communication status of the sensor such as an online state or an offline state.

The sensors are typically mounted per phase on the overhead lines in proximity of the nodes. The sensors provide voltage and current values that are sensed in respective overhead lines. According to an embodiment, the sensors are capable of generating a low voltage signal based on the line voltage sensed on the overhead line. According to another embodiment, the sensors are capable of generating a negative rate of change of line current signal based on the line current flowing through the overhead line. One or more sensors provide the overhead line data associated with their respective overhead line sections, to a communication gateway that is in proximity of the sensors, over a short range wired or wireless communication. The computer implemented method then obtains the overhead line data from the communication gateway(s). According to an embodiment, the computer implemented method obtains the overhead line data from a server that stores the overhead line data received from the sensor(s) and/or the communication gateways into a database.

According to one embodiment, the computer implemented method obtains the overhead line data periodically from the sensor, that is, at predefined time intervals to allow near real-time data capture from the sensors. According to another embodiment, the computer implemented method obtains the overhead line data continuously. According to yet another embodiment, the computer implemented method obtains the overhead line data upon occurrence of a predefined event such as a fault.

The computer implemented method determines fault detection parameters associated with the node(s) of the overhead line on occurrence of a predefined node condition at the node(s). As used herein, the predefined node condition at a node comprises a low voltage and a negative rate of change of the line current at the node. According to an embodiment, when there exists a low voltage but not a negative rate of change of line current, the computer implemented method generates an alert indicating to the utility maintenance team a possible open circuit on the feeder associated therewith.

The low voltage occurrence at the node is determined based on the line voltage from the overhead line data and a predetermined voltage threshold. For example, the predetermined voltage threshold for an overhead line having a rated voltage of 33 kV is in a range of about 45% to about 70%, that is a low voltage exists when the line voltage is greater than about 45% of the rated voltage but less than about 70% of the rated voltage.

Also used herein, "fault detection parameters" refer to values associated with the node that enable the utility maintenance team in localizing the fault, that is, the open circuit condition on the overhead line. The fault detection parameters comprise, for example, a total number of predecessors of the node, a total number of offline predecessors of the node, a perimeter of the node, and a computation precision index of the node.

As used herein, "total number of predecessors" of a node refers to a number of nodes existing along a feeder section of an overhead line between the node and the substation.

Also used herein, "total number of offline predecessors" refers to a number of predecessor nodes that have not communicated, for example, during occurrence of the predefined event, that is a fault or for a predefined time period such as about 60 minutes, with the communication gateway.

The computer implemented method considers offline predecessors of a node as those predecessors which are adjacent to one another and in an offline state and in proximity of the node.

Also used herein, "perimeter" of a node refers to a nearest online predecessor of the node. The perimeter defines a search area for the utility maintenance team to patrol into. For example, the perimeter for a node $N_x$ may be node $N_y$ indicating that the maintenance utility team needs to patrol an area of the overhead line between the nodes $N_x$ and $N_y$ to fix the root cause of the fault.

Also used herein, "computation precision index" of a node refers to a factor indicating an accuracy or a confidence weightage of the associated node having an open circuit in its proximity. The computation precision index ranges between 0 and 1, 0 being lowest confidence weightage and 1 being highest confidence weightage. The computer implemented method computes the computation precision index of a node based on the total number of predecessors of the node and the total number of offline predecessors of the node using the formula below:

$$I_N = 1 - \left(\frac{N_{OFF}}{N_{TNP}}\right)$$

Wherein, $I_N$ is the computation precision index of a node N;

$N_{OFF}$ is the total number of offline predecessor nodes of the node N; and $N_{TNP}$ is the total number of predecessor nodes of the node N.

The computer implemented method generates an output based on the fault detection parameters. The output is provided to the utility maintenance team for fixing a fault. The output indicates potential presence of an open circuit at one or more nodes. The output comprises a list of the fault detection parameters associated with one or more nodes, for example, a list $L_{Feeder}$ of potentially affected 'n' nodes that is the nodes having predefined node condition therein, along a feeder comprises:

$$L_{Feeder}=[\{N_1,I_{N1},P_{N1}\} \ldots ,\{N_n,I_{Nn},P_{Nn}\}]$$

Wherein $P_N$ is the perimeter of the node.

The computer implemented method stores the aforementioned list of the fault detection parameters, for example, in a fault management database.

Also disclosed herein, is a computer program product (non-transitory computer readable storage medium having instructions, which when executed by a processor, perform actions) comprising a non-transitory computer readable storage medium storing computer program codes that comprise instructions executable by at least one processor. The computer program codes multiple computer program codes for executing steps carried out by the aforementioned computer implemented method disclosed herein.

Also disclosed herein, is a fault detection and management system (FDAMS) for managing an open circuit fault on an overhead line in a power network. The FDAMS comprises a non-transitory computer readable storage medium storing computer program instructions defined by modules of the FDAMS, at least one processor communicatively coupled to the non-transitory computer readable storage medium, and executing the computer program instructions, and the modules of the FDAMS.

The modules of the FDAMS comprise a data reception module and a data processing module communicatively coupled to one another. The data reception module obtains overhead line data from a sensor mounted on the overhead line, wherein the overhead line data comprises line voltage and the line current present at a node in real-time.

The data processing module determines fault detection parameters associated with one or more nodes of the overhead line on occurrence of a predefined node condition at the one or more nodes. The predefined node condition being a low voltage and a negative rate of change of the line current at the node. The data processing module determines the low voltage occurrence at the node based on the line voltage from the overhead line data and a predetermined voltage threshold. The fault detection parameters associated with a node comprise a total number of predecessors of the node, a total number of offline predecessors of the node, a perimeter of the node, and a computation precision index of the node.

The data processing module computes the computation precision index of a node based on the total number of predecessors of the node and the total number of offline predecessors of the node. The computation precision index of the node ranges between 0 and 1.

The data processing module generates an output based on the fault detection parameters, wherein the output indicates potential presence of an open circuit at one or more nodes. The output comprises a list of the fault detection parameters associated with one or more nodes. The data processing module stores the output in a fault management database of the FDAMS.

The computer implemented method, the fault detection and management system (FDAMS), and the computer program product disclosed herein allow the utility maintenance team to easily detect and localize an open circuit fault occurring in various scenarios. In one example when a jumper has opened without any overcurrent fault event and without breaker opening due to degraded aged assets. In another example, when a jumper has opened with an overcurrent fault and with breaker open due to foreign objects falling on the overhead line and generating a high current therein. In this example, the utility maintenance team is intimated upon successful charging of the line, that is, upon closing of the breaker.

The above mentioned and other features of embodiments of the invention will now be addressed with reference to the accompanying drawings of embodiments of the present invention. The illustrated embodiments are intended to illustrate, but not limit the invention.

BRIEF DESCRIPTION

Some of the embodiments will be described in detail, with reference to the following figures, wherein like designations denote like members, wherein.

Figure 1:
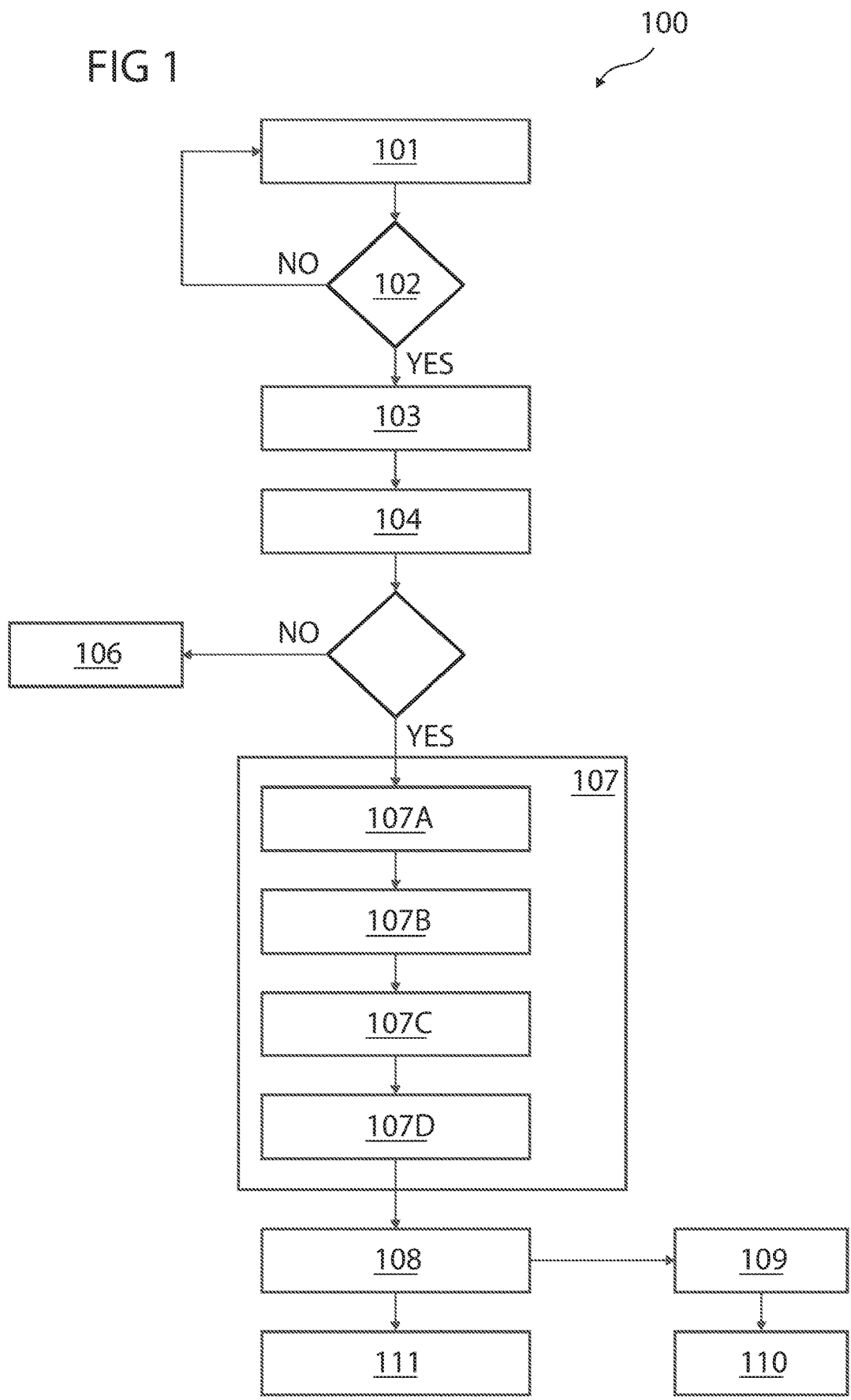
FIG. 1 illustrates a process flowchart of a computer-implemented method for managing open circuit faults on overhead lines, according to an embodiment of the present disclosure.
Figure 2:
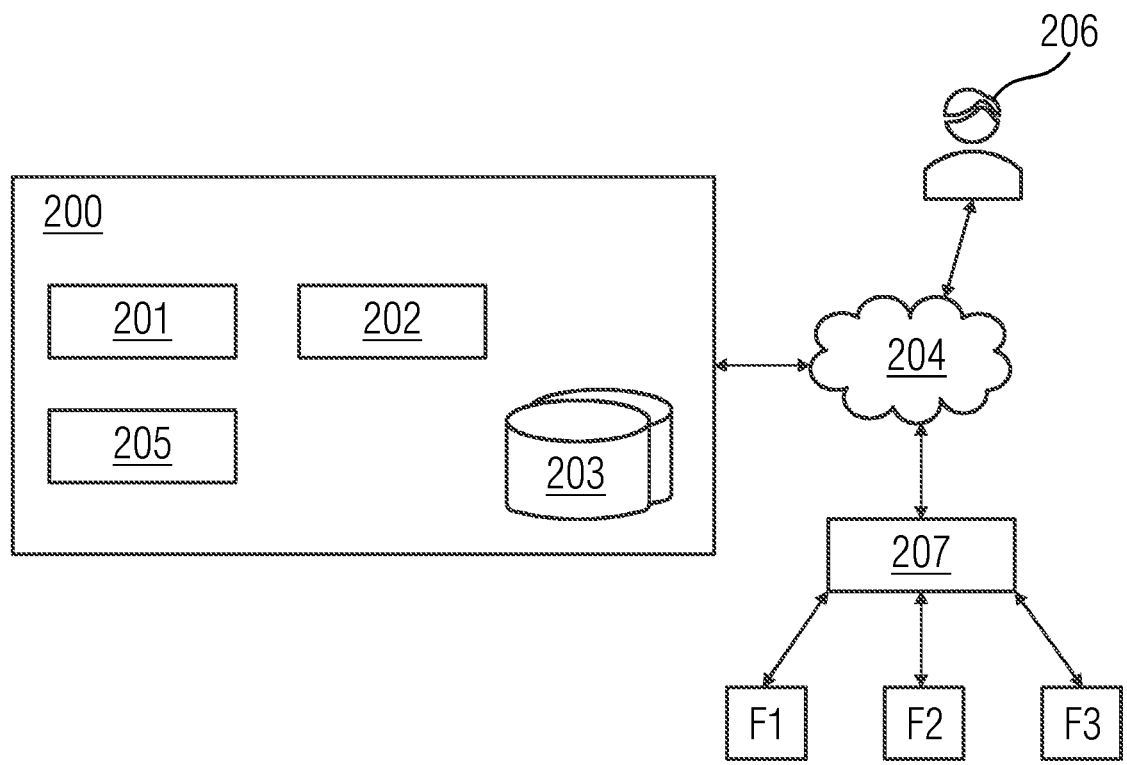
FIG. 2 illustrates a fault detection and management system (FDAMS) for managing open circuit faults on overhead lines, according to an embodiment of the present disclosure.
Figure 3:
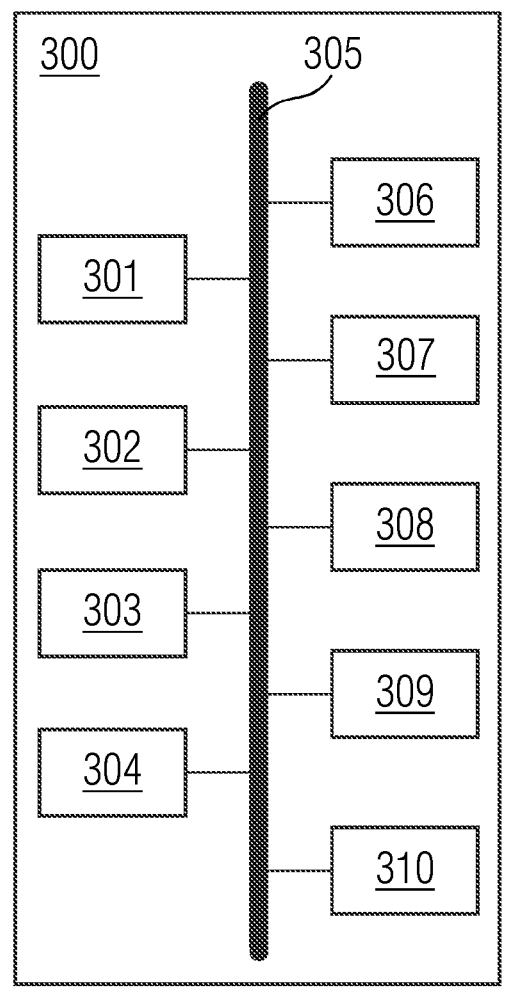
Figure 4:
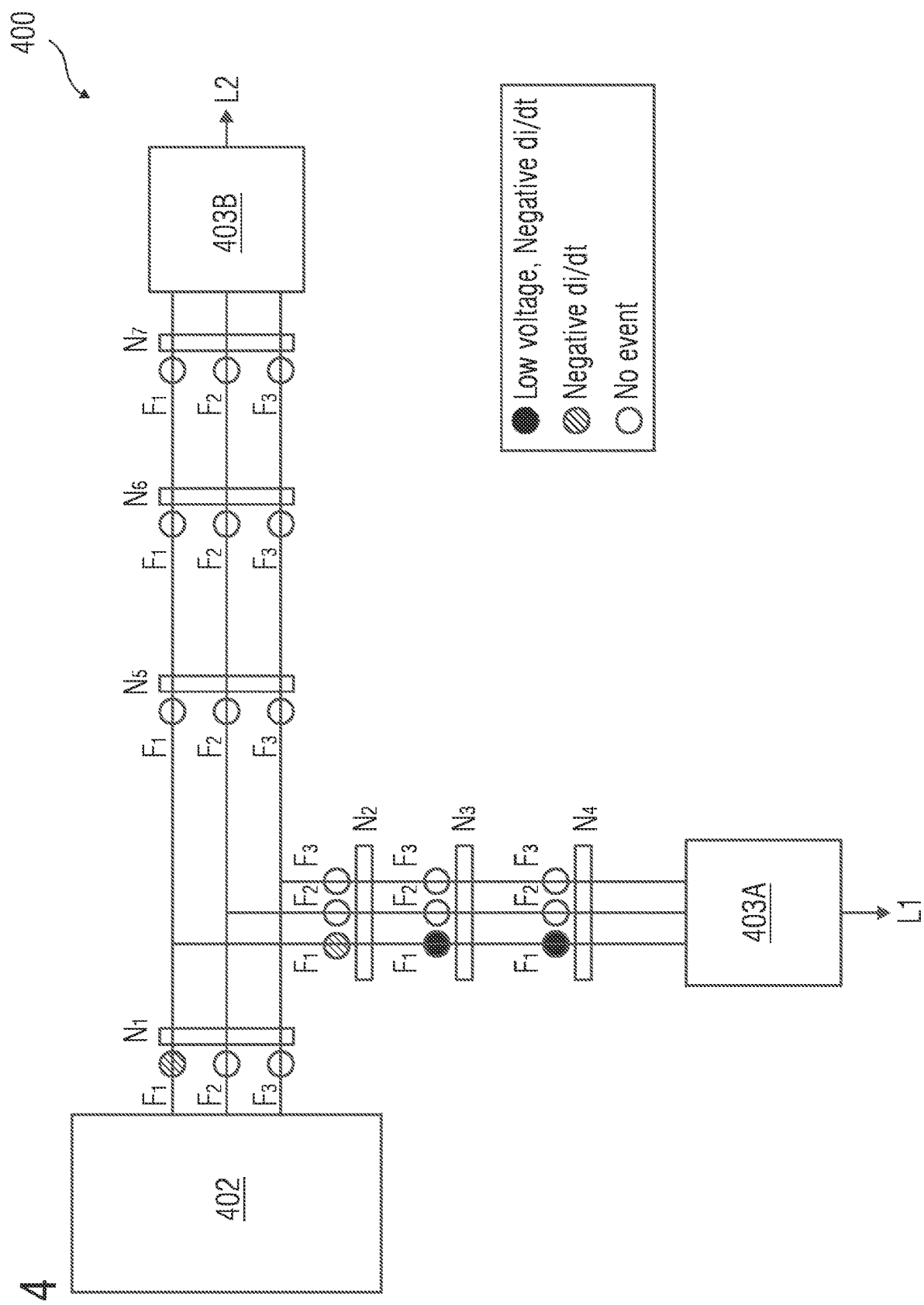

FIG. 3 is a block diagram illustrating an architecture of a computer system employed by the fault detection and management system (FDAMS) shown in FIG. 2, for managing open circuit faults on overhead lines, according to an embodiment of the present disclosure; and FIG. 4 illustrates an exemplary graphical representation of a section of a power network having an open jumper therein which is detected via the computer implemented method shown in FIG. 1, according to an embodiment of the present disclosure.

DETAILED DESCRIPTION

FIG. 1 illustrates a process flowchart 100 of a computer-implemented method for managing open circuit faults on overhead lines, according to an embodiment of the present disclosure.

The computer implemented method obtains 101 overhead line data from a sensor, such as a fault sensing indicator, mounted on the overhead line. The overhead line data includes line voltage and line current sensed by the sensor. The overhead line data also includes signals associated with the line voltage such as a voltage ON signal, voltage OFF signal, or a voltage low signal, signals associated with line current such as a rapid drop detected by the sensor in the line current value, etc.

The computer implemented method determines 102 whether there exists a low voltage condition based on the overhead line data, for example, upon receiving a voltage low signal from the sensor or in absence of such a signal by comparing the line voltage with a predetermined voltage threshold. For example, if the line voltage is greater than about 45% of the rated voltage but less than about 70% of the rated voltage then a low voltage condition exists. If there is no low voltage condition existing then the computer implemented method returns to monitoring, that is, obtaining 101 the overhead line data from the sensor.

When there is a low voltage condition existing, the computer implemented method identifies 103 a potentially affected feeder associated therewith. The computer implemented method then determines 104 whether there exists a rapid drop in the line current along with the low voltage condition at one or more nodes of the potentially affected feeder. This is performed by obtaining overhead line data from each of the sensors mounted at each of the nodes of the potentially affected feeder. When the low voltage condition exists without the rapid drop in the line current, the computer implemented method generates 106 a notification for the utility maintenance team indicating a possible open circuit condition. However, when both the conditions are present, then the computer implemented method for each such node in the potentially affected feeder, determines 107 fault detection parameters which enable the utility maintenance team in identifying a possible open circuit condition and a location of the fault.

For determining the fault detection parameters of a node, the computer implemented method identifies 107A a total number of predecessors of the node, that is, a total number of nodes existing on the potentially affected feeder between the node and the substation. The computer implemented method then identifies 107B a total number of offline predecessors of the node, that is, a total number of nodes on the potentially affected feeder that have not been communicating for a predetermined time period, for example, over an hour or have not been communicating during occurrence of the predefined event, that is a fault. The computer implemented method then computes 107C a perimeter of the node, that is, the nearest online predecessor node. The computer implemented method then computes 107D a computation precision index of the node, that indicates an accuracy or a confidence weightage of the node having an open circuit condition therein. The computation precision index is calculated based on the total number of offline predecessors of the node and the total number of predecessors of the node.

Upon determining the fault detection parameters of a node, the computer implemented method generates 108 a node entry comprising the node for which the fault detection parameters have been determined, the computation precision index of the node, and the perimeter of the node. The computer implemented method then appends 109 each such node entry of the nodes on the potentially affected feeder, to a list of affected nodes. The computer implemented method stores 110 the list of affected nodes in a fault management database. This list of affected nodes may be used for future referenced by the utility maintenance team and or for running data analytics and generating one or more recommendations by the utility maintenance team. The computer implemented method generates 111 an output having the node entry for which the fault detection parameters have been determined and renders the output to the utility maintenance team thereby, enabling them to take a measured action for fixing the open circuit condition on the potentially affected feeder.

FIG. 2 illustrates a fault detection and management system (FDAMS) for managing open circuit faults on overhead lines, according to an embodiment of the present disclosure. The FDAMS 200, is installable on and accessible by a user device, for example, a personal computing device, a workstation, a client device, a network enabled computing device, any other suitable computing equipment, and combinations of multiple pieces of computing equipment being used by a user 206. The FDAMS 200 disclosed herein is in an operable communication with a communication gateway 207 over a communication network 204. The communication gateway 207 in turn is in an operable communication with sensors F1-F3, for example, fault sensing indicators, mounted on an overhead line. The communication network 204 is, for example, a wired network, a wireless network, or a network formed from any combination thereof.

The FDAMS 200 is downloadable and usable on the user device, or, is configured as a web-based platform, for example, a website hosted on a server or a network of servers, or, is implemented in the cloud computing environment as a cloud computing-based platform implemented as a service for managing open circuit faults on overhead lines. A user 206 of the FDAMS 200 in this case accesses the FDAMS 200 via the communication network 204. The user 206 is typically an operator at a utility maintenance company responsible for maintaining the overhead lines.

The FDAMS 200 disclosed herein comprises a non-transitory computer readable storage medium and at least one processor communicatively coupled to the non-transitory computer readable storage medium. As used herein, "non-transitory computer readable storage medium" refers to all computer readable media, for example, non-volatile media, volatile media, and transmission media except for a transitory, propagating signal. The non-transitory computer readable storage medium is configured to store computer program instructions defined by modules, for example, 201, 202, etc., of the FDAMS 200. The processor is configured to execute the defined computer program instructions. As illustrated in FIG. 2, the FDAMS 200 comprises a graphical user interface (GUI) 205. A user 206 using the user device can access the FDAMS 200 via the GUI 205. The GUI 205 is, for example, an online web interface, a web based downloadable application interface, etc. The FDAMS 200 further comprises a data reception module 201 and a data processing module 202.

The data reception module 201 obtains overhead line data from a sensor mounted on the overhead line, wherein the overhead line data comprises line voltage and the line current present at a node in real-time. The data processing module 202 determines fault detection parameters associated with one or more nodes of the overhead line on occurrence of a predefined node condition at the one or more nodes. The predefined node condition being a low voltage and a negative rate of change of the line current at the node. The data processing module 202 determines the low voltage occurrence at the node based on the line voltage from the overhead line data and a predetermined voltage threshold. The fault detection parameters associated with a node comprise a total number of predecessors of the node, a total number of offline predecessors of the node, a perimeter of the node, and a computation precision index of the node.

The data processing module 202 computes the computation precision index of a node based on the total number of predecessors of the node and the total number of offline predecessors of the node. The computation precision index of the node ranges between 0 and 1.

The data processing module 202 generates an output based on the fault detection parameters, wherein the output indicates potential presence of an open circuit at one or more nodes. The output comprises a list of the fault detection parameters associated with one or more nodes. The data processing module stores the output in a fault management database 203 of the FDAMS 200.

FIG. 3 is a block diagram illustrating an architecture of a computer system 300 employed by the fault detection and management system (FDAMS) 200 shown in FIG. 2, for managing open circuit faults on overhead lines, according to an embodiment of the present disclosure. The FDAMS 200 employs the architecture of the computer system 300. The computer system 300 is programmable using a high-level computer programming language. The computer system 300 may be implemented using programmed and purposeful hardware. The computer system 300 comprises a processor 301, a non-transitory computer readable storage medium such as a memory unit 302 for storing programs and data, an input/output (I/O) controller 303, a network interface 304, a data bus 305, a display unit 306, input devices 307, a fixed media drive 308 such as a hard drive, a removable media drive 309 for receiving removable media, output devices 310, etc. The processor 301 refers to any one of microprocessors, central processing unit (CPU) devices, finite state machines, microcontrollers, digital signal processors, an application specific integrated circuit (ASIC), a field-programmable gate array (FPGA), etc., or any combination thereof, capable of executing computer programs or a series of commands, instructions, or state transitions. The processor 301 may also be implemented as a processor set comprising, for example, a general-purpose microprocessor and a math or graphics co-processor. The FDAMS 200 disclosed herein is not limited to a computer system 300 employing a processor 301. The computer system 300 may also employ a controller or a microcontroller. The processor 301 executes the modules, for example, 201, 202, etc., of the FDAMS 200.

The memory unit 302 is used for storing programs, applications, and data. For example, the modules 201, 202, etc., of the FDAMS 200 are stored in the memory unit 302 of the computer system 300. The memory unit 302 is, for example, a random-access memory (RAM) or another type of dynamic storage device that stores information and instructions for execution by the processor 301. The memory unit 302 also stores temporary variables and other intermediate information used during execution of the instructions by the processor 301. The computer system 300 further comprises a read only memory (ROM) or another type of static storage device that stores static information and instructions for the processor 301. The I/O controller 303 controls input actions and output actions performed by the FDAMS 200.

The network interface 304 enables connection of the computer system 300 to the communication network 204. For example, the FDAMS 200 connects to the communication network 204 via the network interface 304. In an embodiment, the network interface 304 is provided as an interface card also referred to as a line card. The network interface 304 comprises, for example, interfaces using serial protocols, interfaces using parallel protocols, and Ethernet communication interfaces, interfaces based on wireless communications technology such as satellite technology, radio frequency (RF) technology, near field communication, etc. The data bus 305 permits communications between the modules, for example, 201, 202, 203, 205, etc., of FDAMS 200.

The display unit 306, via the graphical user interface (GUI) 205, displays information such as the computation precision index for a node, the perimeter, etc., for enabling the utility maintenance teams to localize the faulty section of the power network. The display unit 306, via the GUI 205, also displays information such as user interface elements including text fields, buttons, windows, etc., for allowing a user to provide his/her inputs such as thresholds for determining low voltage conditions, offline nodes, etc. The display unit 306 comprises, for example, a liquid crystal display, a plasma display, an organic light emitting diode (OLED) based display, etc. The input devices 307 are used for inputting data into the computer system 300. The input devices 307 are, for example, a keyboard such as an alphanumeric keyboard, a touch sensitive display device, and/or any device capable of sensing a tactile input.

Computer applications and programs are used for operating the computer system 300. The programs are loaded onto the fixed media drive 308 and into the memory unit 302 of the computer system 300 via the removable media drive 309. In an embodiment, the computer applications and programs may be loaded directly via the communication network 204. Computer applications and programs are executed by double clicking a related icon displayed on the display unit 306 using one of the input devices 307. The output devices 310 output the results of operations performed by the FDAMS 200. For example, the FDAMS 200 provides graphical representation of the power network along with potential faulty sections on the overhead lines, using the output devices 310. Alternatively, the graphical representations may include statistics and analytics of the historical data associated with the power network such as various overhead line sections or nodes where an open circuit fault has occurred in the past.

The processor 301 executes an operating system. The computer system 300 employs the operating system for performing multiple tasks. The operating system is responsible for management and coordination of activities and sharing of resources of the computer system 300. The operating system further manages security of the computer system 300, peripheral devices connected to the computer system 300, and network connections. The operating system employed on the computer system 300 recognizes, for example, inputs provided by the users using one of the input devices 307, the output display, files, and directories stored locally on the fixed media drive 308. The operating system on the computer system 300 executes different programs using the processor 301. The processor 301 and the operating system together define a computer platform for which application programs in high level programming languages are written.

The processor 301 of the computer system 300 employed by the FDAMS 200 retrieves instructions defined by the modules 201, 202, etc., of the FDAMS 200 for performing respective functions disclosed in the detailed description of FIG. 2. The processor 301 retrieves instructions for executing the modules, for example, 201, 202, etc., of the FDAMS 200 from the memory unit 302. A program counter determines the location of the instructions in the memory unit 302. The program counter stores a number that identifies the current position in the program of each of the modules, for example, 201, 202, etc., of the FDAMS 200. The instructions fetched by the processor 301 from the memory unit 302 after being processed are decoded. The instructions are stored in an instruction register in the processor 301. After processing and decoding, the processor 301 executes the instructions, thereby performing one or more processes defined by those instructions.

At the time of execution, the instructions stored in the instruction register are examined to determine the operations to be performed. The processor 301 then performs the specified operations. The operations comprise arithmetic operations and logic operations. The operating system performs multiple routines for performing several tasks required to assign the input devices 307, the output devices 310, and memory for execution of the modules, for example, 201, 202, etc., of the FDAMS 200. The tasks performed by the operating system comprise, for example, assigning memory to the modules, for example, 201, 202, etc., of the FDAMS 200, and to data used by the FDAMS 200, moving data between the memory unit 302 and disk units, and handling input/output operations. The operating system performs the tasks on request by the operations and after performing the tasks, the operating system transfers the execution control back to the processor 301. The processor 301 continues the execution to obtain one or more outputs. The outputs of the execution of the modules, for example, 201, 202, etc., of the FDAMS 200 are displayed to the user on the GUI 205.

For purposes of illustration, the detailed description refers to the FDAMS 200 being run locally on the computer system 300, however the scope of embodiments of the present invention is not limited to the FDAMS 200 being run locally on the computer system 300 via the operating system and the processor 301, but may be extended to run remotely over the communication network 204 by employing a web browser and a remote server, a mobile phone, or other electronic devices. One or more portions of the computer system 300 may be distributed across one or more computer systems (not shown) coupled to the communication network 204.

Disclosed herein is also a computer program product comprising a non-transitory computer readable storage medium that stores computer program codes comprising instructions executable by at least one processor 301 for managing open circuit faults on overhead lines, as disclosed in aforementioned description. The computer program product comprises a first computer program code for obtaining overhead line data from a sensor mounted on the overhead line; a second computer program code for determining fault detection parameters associated with one or more nodes of the overhead line on occurrence of a predefined node condition at the one or more nodes; and a third computer program code for generating an output based on the fault detection parameters, wherein the output indicates potential presence of an open circuit at one or more nodes.

In an embodiment, a single piece of computer program code comprising computer executable instructions, performs one or more steps of the computer implemented method according to the present disclosure, for managing open circuit faults on overhead lines. The computer program codes comprising computer executable instructions are embodied on the non-transitory computer readable storage medium. The processor 301 of the computer system 300 retrieves these computer executable instructions and executes them. When the computer executable instructions are executed by the processor 301, the computer executable instructions cause the processor 301 to perform the steps of the method for managing open circuit faults on overhead lines.

FIG. 4 illustrates an exemplary graphical representation of a section of a power network 400 having an open jumper 401 therein which is detected via the computer implemented method shown in FIG. 1, according to an embodiment of the present disclosure. The power network 400 shown herein comprises a section having nodes N1-N7, of which the nodes N1, N2, N3, and N4 for one branch, and are connected to a load L1 via a transformer 403A and the nodes N1, N5, N6, and N7 form another branch, and are connected to a load L2 via a transformer 403B. The node N1 is connected to a bus of a substation 402. The power network 400 is a three-phase distribution power network having overhead lines also referred to as power conductors running along each of the feeders, that is, between the substation 402 and the loads L1 and L2. Each overhead line has a sensor F1, F2, or F3 mounted thereon in proximity to the respective nodes N1-N7, as shown in FIG. 4. The sensors F1-F3 are, for example, fault sensors, V/I sensors, etc., which are capable of monitoring the voltage and the current in the corresponding feeder.

The computer implemented method disclosed herein, continuously monitors the power network 400 by obtaining the voltages from each of the sensors F1-F3 at each of the nodes N1-N7 in the power network 400. When there exists a low voltage condition on at least one of the nodes, the computer implemented method initiates further steps on the corresponding feeder. The low voltage condition is, for example, when the line voltage recorded by the sensor F1-F3 is less than 70% of the rated voltage but greater than 45% of the rated voltage.

As shown in FIG. 4, there exists an open jumper 401 on the branch of the feeder having nodes N1-N4. Therefore, a low voltage condition is reported by one of the sensors F1-F3 on the corresponding branch, for example at nodes N3 and N4. Thus, the computer implemented method focuses on this branch of the feeder having nodes N1-N4. The computer implemented method further obtains current values from the sensors F1-F3 at the nodes N3 and N4 and verifies whether there is a rapid drop in line current identified therein.

If yes, that is if both the nodes N3 and N4 have both the conditions of low voltage and negative rate of change of current, then the computer implemented method focuses on the node N3 as it closer to the source. The computer implemented method for the corresponding phase, that is the overhead line, at the node N3, determines a total number of predecessors $N_{TNP}$ of a node N calculated as a number of nodes preceding the node N on the feeder towards the direction of the substation. For example, $N_{TNP}$ of N3 is 2.

Then, the computer implemented method for the node N3 determines a number of offline predecessor nodes $N_{OFF}$ of a node N calculated as total number of nodes, the sensors F1-F3 for which have not communicated for more than a predetermined threshold such as over an hour or at the moment of the occurrence of a fault event. The offline predecessor nodes are calculated as nodes adjacent to one another and in proximity of the node N3, that have been offline.

For example, $N_{OFF}$ of N3 assuming that the node N2 was offline and the Node N1 was online $N_{OFF}$ for Node N3 is 1.

However, consider an example where the feeder has several nodes $N1_A$-$N1_D$, instead of a single node N1, connected between the substation 402 and the node N2 such that the node N3 now has 5 nodes between itself and the substation 402. Assume that the nodes $N1_D$ and $N1_B$ are also offline along with the node N2 at the time of occurrence of a fault. Thus, the offline nodes in terms of their positions with respect to the node N3 are $1^{st}$ node that is node N2, $2^{nd}$ node that is node N1D, and $4^{th}$ node that is node N1B from the node N3. In this case the total number of offline predecessors for node N3 is 2 including the node N2 and the node $N1_D$ as these are the nodes adjacent to one another, offline, and in proximity to node N3.

The computer implemented method then, determines a perimeter $P_N$ as the nearest online predecessor node. For example, the perimeter $P_{N3}$ for the node N3 is N1 considering there exists one nearest online predecessor.

Post which, the computer implemented method determines a computation precision index $I_N$ for a node N as:

$$I_N = 1 - \left(\frac{N_{OFF}}{N_{TNP}}\right)$$

Wherein a computation precision index of 1 indicates highest possible accuracy of a fault, that is, an open jumper whereas, a computation precision index of 0 indicates lowest possible accuracy of a fault.

For example, the computation precision index $I_{N3}$ for the node N3=1–(½)=0.5.

The computer implemented method then creates an entry $E_N$ for a node N having therein the node N, the computation precision index $I_N$, and the perimeter P:

$$E_N = \{N, I_N, P_N\}$$

This entry $E_N$ is then added to a list maintained for the corresponding feeder. For example, the list for the feeder having the open jumper condition 401 as shown in FIG. 4 comprises:

$$L_{Feeder\ 1} = [\{N_3, I_{N3}, P_{N3}\}]$$

Wherein the list comprises:

$$L_{Feeder\ 1} = [\{N_3, 0.5, N1\}]$$

The list is populated for every node N1-N7 of the overhead line, monitored by the sensor F1, F2, or F3 wherein a low voltage condition and a negative rate of change of line current has been detected. Thus, from the above list, the utility maintenance team can easily perceive that the search perimeter from node N3 up to node N1 needs to be monitored to fix the fault condition, that is an open jumper.

The computer implemented method and the fault detection and management system (FDAMS) thus enable the utility to localize the faulty section of an overhead line with much less time as compared to the prevalent techniques and solutions.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements.

The invention claimed is:

1. A computer implemented method for managing an open circuit fault on an overhead line in a power network, comprising:
   obtaining overhead line data from a sensor mounted on the overhead line;
   determining fault detection parameters associated with one or more nodes of the overhead line on occurrence of a predefined node condition at the one or more nodes, wherein the fault detection parameters associated with a respective node comprise
      a total number of predecessors of the respective node, wherein a total number of predecessors of the respective node refers to a number of nodes existing along a feeder section of an overhead line between the respective node and a substation,
      a total number of offline predecessors of the respective node, wherein a total number of offline predecessors of the respective node refers to a number of predecessor nodes that have not communicated,
      a perimeter of the respective node, wherein a perimeter of the respective node refers to a nearest online predecessor of the respective node, and
      a computation precision index of the respective node, wherein computation precision index of the respective node refers to a factor indicating an accuracy or a confidence weightage of the respective node having an open circuit in its proximity,
   further wherein the predefined node condition at the respective node comprises a low voltage and a negative rate of change of a line current at the respective node;
   generating an output based on the fault detection parameters, wherein the output indicates potential presence of an open circuit at the one or more nodes; and
   rendering the output on a graphical user interface of a fault detection and management system managing the open circuit fault on the overhead line in the power network for enabling utility maintenance teams to localize a faulty section of the power network.

2. The computer implemented method according to claim 1, wherein the overhead line data comprises line voltage and the line current present at a node in real-time.

3. The computer implemented method according to claim 1, wherein the predefined node condition at a node comprises a low voltage and a negative rate of change of the line current at the node.

4. The computer implemented method according to claim 3, further comprising determining low voltage occurrence at the node based on the line voltage from the overhead line data and a predetermined voltage threshold.

5. The computer implemented method according to claim 1, further comprising computing the computation precision index of the respective node based on the total number of predecessors of the respective node and the total number of offline predecessors of the respective node.

6. The computer implemented method according to claim 1, wherein the computation precision index of the respective node ranges between 0 and 1.

7. The computer implemented method according to claim 1, wherein the output comprises a list of the fault detection parameters associated with one or more nodes.

8. The computer implemented method according to claim 7, further comprises storing the list of the fault detection parameters in a fault management database.

9. A computer-program product having machine-readable instructions stored therein, which when executed by one or more processing units, cause the processing units to perform the computer implemented method according to claim 1.

10. A fault detection and management system for managing an open circuit fault on an overhead line in a power network, the fault detection and management system comprising:
a non-transitory computer readable storage medium storing computer program instructions defined by modules of the fault detection and management system;
at least one processor communicatively coupled to the non-transitory computer readable storage medium, wherein the at least one processor executes the computer program instructions; and
the modules of the fault detection and management system comprising:
a data reception module configured to obtain overhead line data from a sensor mounted on the overhead line, wherein the overhead line data comprises line voltage and line current present at a node in real-time;
a data processing module configured to determine fault detection parameters associated with one or more nodes of the overhead line on occurrence of a predefined node condition at the one or more nodes, wherein the fault detection parameters associated with a respective node comprise a total number of predecessors of the respective node, wherein the total number of predecessors of the respective node refers to a number of nodes existing along a feeder section of an overhead line between the respective node and a substation, a total number of offline predecessors of the respective node, wherein a the total number of offline predecessors of the respective node refers to a number of predecessor nodes that have not communicated, a perimeter of the respective node, wherein a perimeter of the respective node refers to a nearest online predecessor of the respective node, and a computation precision index of the respective node, wherein computation precision index of the respective node refers to a factor indicating an accuracy or a confidence weightage of the respective node having an open circuit in its proximity, and wherein the predefined node condition at the respective node comprises a low voltage and a negative rate of change of a line current at the respective node;
the data processing module configured to generate an output based on the fault detection parameters, wherein the output indicates potential presence of an open circuit at the one or more nodes, wherein the output comprises a list of the fault detection parameters associated with the one or more nodes; and
the data processing module configured to render the output on a graphical user interface of the fault detection and management system managing the open circuit fault on the overhead line in the power network for enabling utility maintenance teams to localize a faulty section of the power network.

11. The fault detection and management system according to claim 10, wherein the data processing module is configured to determine low voltage occurrence at the node based on the line voltage from the overhead line data and a predetermined voltage threshold.

12. The fault detection and management system according to claim 10, wherein the data processing module computes the computation precision index of a node based on the total number of predecessors of the node and the total number of offline predecessors of the node, and wherein the computation precision index of the node ranges between 0 and 1.

13. The fault detection and management system according to claim 10, wherein the data processing module stores the output in a fault management database of the fault detection and management system.

14. A computer implemented method for managing an open circuit fault on an overhead line in a power network, comprising:
obtaining overhead line data from a sensor mounted on the overhead line;
determining at least one fault detection parameter associated with one or more nodes of the overhead line on occurrence of a predefined node condition at the one or more nodes, wherein the at least one fault detection parameter associated with a respective node is selected from the group consisting of: a total number of predecessors of the respective node, wherein the total number of predecessors of the respective node refers to a number of nodes existing along a feeder section of an overhead line between the respective node and a substation; a total number of offline predecessors of the respective node, wherein the total number of offline predecessors of the respective node refers to a number of predecessor nodes that have not communicated; a perimeter of the respective node, wherein the perimeter of the respective node refers to a nearest online predecessor of the respective node; a computation precision index of the respective node, wherein the computation precision index of the respective node refers to a factor indicating an accuracy or a confidence weightage of the respective node having an open circuit in its proximity; and combinations thereof,
further wherein the predefined node condition at the respective node comprises a low voltage and a negative rate of change of a line current at the respective node;
generating an output based on the at least one fault detection parameter, wherein the output indicates potential presence of an open circuit at the one or more nodes; and
rendering the output on a graphical user interface of a fault detection and management system managing the open circuit fault on the overhead line in the power network for enabling utility maintenance teams to localize a faulty section of the power network.

15. The computer implemented method according to claim 14, wherein the overhead line data comprises line voltage and the line current present at a node in real-time.

16. The computer implemented method according to claim 14, wherein the predefined node condition at a node comprises a low voltage and a negative rate of change of the line current at the node.

17. The computer implemented method according to claim 14, further comprising determining low voltage occurrence at the node based on the line voltage from the overhead line data and a predetermined voltage threshold.

18. The computer implemented method according to claim 14, further comprising computing the computation precision index of the respective node based on the total number of predecessors of the respective node and the total number of offline predecessors of the respective node.

19. The computer implemented method according to claim 14, wherein the output comprises a list of the at least one fault detection parameter associated with one or more nodes.

20. The computer implemented method according to claim 19, further comprises storing the list of the fault detection parameters in a fault management database.

* * * * *